US008790567B2

(12) United States Patent
Uchida et al.

(10) Patent No.: US 8,790,567 B2
(45) Date of Patent: Jul. 29, 2014

(54) ELECTRET SHEET

(75) Inventors: Kazuho Uchida, Shimamoto-cho (JP); Takazumi Okabayashi, Shimamoto-cho (JP); Yoshiro Tajitsu, Suita-shi (JP)

(73) Assignees: Sekisui Chemical Co., Ltd., Osaka (JP); A School Corporation Kansai University, Osaka (JP)

( * ) Notice: Subject to any disclaimer, the term of this patent is extended or adjusted under 35 U.S.C. 154(b) by 0 days.

(21) Appl. No.: 14/112,682

(22) PCT Filed: Apr. 12, 2012

(86) PCT No.: PCT/JP2012/060012
§ 371 (c)(1),
(2), (4) Date: Dec. 12, 2013

(87) PCT Pub. No.: WO2012/144411
PCT Pub. Date: Oct. 26, 2012

(65) Prior Publication Data
US 2014/0091249 A1    Apr. 3, 2014

(30) Foreign Application Priority Data

Apr. 21, 2011    (JP) .................................. 2011-095444

(51) Int. Cl.
*B03C 3/00*    (2006.01)
*B03C 3/28*    (2006.01)
*H01L 41/193*    (2006.01)

(52) U.S. Cl.
USPC ................... 264/436; 204/157.63; 428/304.4; 425/174.6

(58) Field of Classification Search
USPC ................... 264/436; 204/157.63; 428/304.4; 425/174.6
See application file for complete search history.

(56) References Cited

U.S. PATENT DOCUMENTS 4,626,263 A * 12/1986 Inoue et al. ....................... 96/99
2003/0207642 A1 * 11/2003 Myers et al. ................... 442/414
2010/0175354 A1    7/2010 Mizukami et al.

FOREIGN PATENT DOCUMENTS

| JP | 7-290482 | 11/1995 |
| JP | 2007-145960 | 6/2007 |
| JP | 2010-80743 | 4/2010 |
| WO | 2009/104423 | 8/2009 |

OTHER PUBLICATIONS

International Search Report dated Jul. 17, 2012 issued in International (PCT) Application No. PCT/JP2012/060012.

* cited by examiner

*Primary Examiner* — Kara Boyle
(74) *Attorney, Agent, or Firm* — Wenderoth, Lind & Ponack, L.L.P.

(57) ABSTRACT

Provided is an electret having high piezoelectric properties. An electret sheet of the invention is characterized in that it comprises a synthetic resin sheet is electrified by injecting electric charges thereinto, that the synthetic resin sheet comprises two types of synthetic resins incompatible with each other, and that these synthetic resins form a phase separated structure and are cross-linked through a polyfunctional monomer. Therefore, positive and negative charges in an apparently polarized state are present in the interfacial portions between the two types of synthetic resins incompatible with each other. By applying an external force to the electret sheet to deform it, the relative positions of these positive and negative charges are changed, and these changes cause a favorable electrical response. Therefore, the electret sheet has high piezoelectric properties.

9 Claims, 2 Drawing Sheets

ELECTRET SHEET

TECHNICAL FIELD

The present invention relates to an electret sheet.

BACKGROUND

An electret is a material having thereinside a permanent electric charge imparted by injecting charges into an insulating polymer material. Such an electret formed into fibers is widely used for a dust-collecting filter etc.

It is known that a foamed sheet made of a synthetic resin exhibits very high piezoelectric properties comparable to those of ceramics when bubble membranes forming the bubbles and their vicinities are electrified. It has been proposed to apply an electret that uses such a synthetic resin-made foamed sheet to acoustic pickups, various pressure sensors, etc. with high sensitivity of the electret being utilized.

One method used to improve the piezoelectric properties of such a synthetic resin-made foamed sheet is to reduce the size of the bubbles. Patent Literature 1 discloses a method of reducing the size of bubbles. Although higher performance than that of conventional electrets is obtained, this method has a problem in that a complicated process must be used.

CITATION LIST

Patent Literature

Patent Literature 1: Japanese Patent Application Laid-Open No. 2007-145960

SUMMARY

Technical Problem

The present invention provides an electret having high piezoelectric properties.

Solution to Problem

The electret sheet of the present invention is characterized in that it comprises a synthetic resin sheet electrified by injecting electric charges thereinto, that the synthetic resin sheet comprises two types of synthetic resins incompatible with each other, and that these synthetic resins form a phase separated structure and are cross-linked through a polyfunctional monomer.

More specifically, the electret sheet of the present invention is characterized in that it is formed by injecting electric charges into the synthetic resin sheet to electrify the synthetic resin sheet, that the synthetic resin sheet comprises the two types of synthetic resins incompatible with each other, and that these synthetic resins form a phase separated structure and are cross-linked through a polyfunctional monomer.

The electret sheet comprises the synthetic resin sheet electrified by injecting electric charges thereinto. No particular limitation is imposed on the synthetic resins forming the synthetic resin sheet, and examples thereof include: polyolefin-based resins such as polyethylene-based resins and polypropylene-based resins, a poly-4-methylpentene resin, an ethylene-vinyl acetate copolymer, ethylene-propylene rubber, and an ethylene-propylene-diene copolymer. Two types of synthetic resins incompatible with each other may be appropriately selected. Preferably, the synthetic resins constituting the electret sheet contain a polypropylene-based resin and a polyethylene-based resin, because the obtained electret sheet exhibits high piezoelectric properties. The phrase "synthetic resins incompatible with each other" means that, when the two types of synthetic resins are mixed, these synthetic resins do not form a single phase (a homogeneous system).

Examples of the method of determining whether or not the synthetic resins are incompatible with each other include the following methods. (1) A cross section of the electret sheet is stained with, for example, $RuO_4$, and then the stained cross section of the electret sheet is observed under a transmission electron microscope (TEM) to check whether or not the synthetic resins are separated from each other in the order of nanometers (in a molecular level). When a separated state is confirmed, the synthetic resins are determined to be incompatible with each other. (2) The glass transition temperature (hereinafter referred to as "Tg") of a mixture of the two types of target synthetic resins is measured. When the mixture of the synthetic resins does not show a single Tg but the Tg's of these synthetic resins appear, the synthetic resins are determined to be incompatible with each other. Examples of method (2) above include: a method in which the determination is made based on the number of peaks of the primary dispersion of loss modulus measured by temperature dispersion measurement of dynamic viscoelasticity at a strain of 0.1%, a frequency of 10 Hz, and a temperature increase rate of 3° C./minute (a dynamic viscoelasticity measurement method according to JIS K7198 A) (two or more peaks appear when the synthetic resins are incompatible) or based on the number of maxima of loss tangent (tan δ) (two or more peaks appear when the synthetic resins are incompatible); and a method in which the determination is made based on the number of inflection points representing Tg's measured using a differential scanning calorimeter (DSC) at a heating rate of 10° C./minute according to JIS K7121 (two or more inflection points appear when the synthetic resins are incompatible).

No particular limitation is imposed on the polyethylene-based resin, and examples thereof include low-density polyethylene-based resins, high-density polyethylene-based resins, low-density linear polyethylene-based resins, ethylene-α-olefin copolymers containing more than 50% by weight of the ethylene component, and ethylene-vinyl acetate copolymers. Of these, low-density linear polyethylene-based resins are preferred. The polyethylene-based resin may be used alone or in combination. Examples of the α-olefin to be copolymerized with ethylene include propylene, 1-butene, 1-pentene, 4-methyl-1-pentene, 1-hexene, 1-octene, 1-nonene, and 1-decene.

No particular limitation is imposed on the polypropylene-based resin, and examples thereof include homopropylene and copolymers of propylene and another olefin with the copolymer containing more than 50% by weight of the propylene component. One type of polypropylene-based resin may be used, or a combination of two or more types may be used. The copolymers of propylene and another olefin may be any of block copolymers and random copolymers.

Examples of the olefin to be copolymerized with propylene include α-olefins such as ethylene, 1-butene, 1-pentene, 4-methyl-1-pentene, 1-hexene, 1-octene, 1-nonene, and 1-decene.

If the bending modulus of the polypropylene-based resin is small, a charge retention property of the electret sheet may be decreased and the performance of the electret sheet may not be stably maintained for a long time. Therefore, the bending modulus is preferably 1,400 MPa or higher and more preferably 1,400 to 2,500 MPa. The bending modulus of the polypropylene-based resin is a value measured according to JIS K7171.

When the synthetic resins comprises a polyethylene-based resin and a polypropylene-based resin, if the content of the polyethylene-based resin in the synthetic resins is too small or too large, the piezoelectric properties of the electret sheet may deteriorate. Therefore, the content of the polyethylene-based resin is preferably 5 to 90% by weight and more preferably 30 to 80% by weight. When the synthetic resins comprises the polyethylene-based resin and the polypropylene-based resin, the content of the polypropylene-based resin in the synthetic resins is preferably 10 to 95% by weight and more preferably 20 to 70% by weight because of the same reason as above.

The electret sheet of the present invention contains two types of synthetic resins incompatible with each other, and these synthetic resins form a phase separated structure. In the phase separated structure, charges are easily retained in interfaces between adjacent phases and the vicinities thereof (hereinafter collectively referred to as "interfacial portions"). By electrifying the synthetic resin sheet, in the interfacial portions facing each other through one of the synthetic resins, a first (one) interfacial portion may be positively charged, and a second (the other) interfacial portion may be negatively charged with these charges being paired. Therefore, it is considered that an apparently polarized state is formed.

The relative positional relationship between the positive and negative charges is changed by deforming the electret sheet, and the change causes an electrical response. Therefore, the electret sheet has high piezoelectric properties.

In the electret sheet of the present invention, the two types of synthetic resins constituting the electret sheet are cross-liked through a polyfunctional monomer. The cross-linked structure of the synthetic resins suppresses dissipation of the charges in the electrified interfacial portions to the outside of the synthetic resin sheet and facilitates retention of charges in the functional groups in the polyfunctional monomer. Therefore, the piezoelectric property of the electret sheet is further improved, and the high piezoelectric property is stably maintained for a long time.

No particular limitation is imposed on the above polyfunctional monomer. The polyfunctional monomer is preferably a polyfunctional monomer having, in its molecule, two or more functional groups selected from the group consisting of a vinyl group, an acryloyl group, a methacryloyl group, and an allyl group, more preferably a polyfunctional monomer having two or more vinyl groups, a polyfunctional monomer having two or more acryloyl groups, or a polyfunctional monomer having two or more methacryloyl groups, and particularly preferably a polyfunctional monomer having two or more vinyl groups or a polyfunctional monomer having two or more methacryloyl groups.

Examples of the polyfunctional monomer include divinylbenzene, trimethylolpropane trimethacrylate, trimethylolpropane triacrylate, 1,6-hexanediol di(meth)acrylate, 1,9-nonanediol di(meth)acrylate, triallyl trimellitate, triethylene glycol diacrylate, tetraethylene glycol diacrylate, cyanoethyl acrylate, and bis(4-acryloxypolyethoxyphenyl)propane. Of these, trimethylolpropane trimethacrylate and divinylbenzene are preferred. (Meth)acrylate means methacrylate or acrylate.

No particular limitation is imposed on the amount of the polyfunctional monomer component in the synthetic resin sheet. If the amount is too small, the degree of cross-linking of the synthetic resins becomes low, and the charge retention property of the interfacial portions is not increased sufficiently, so that the piezoelectric properties of the electret sheet may deteriorate. If the amount is too large, the degree of cross-linking of the synthetic resins becomes excessively high, and the flexibility of the synthetic resin sheet becomes low, so that the piezoelectric properties of the electret sheet may deteriorate. Therefore, the amount of the polyfunctional monomer component is preferably 0.5 to 30 parts by weight based on 100 parts by weight of the total amount of the synthetic resins and more preferably 1 to 15 parts by weight.

If the degree of cross-linking of the synthetic resin sheet is low, the synthetic resin is lower cross-linked, and the charge retention property of the interfacial portions cannot be sufficiently increased, so that the piezoelectric properties of the electret sheet may deteriorate. If the degree of cross-linking is high, the degree of cross-linking of the synthetic resins becomes excessively high, and the flexibility of the synthetic resin sheet becomes low, so that the piezoelectric properties of the electret sheet may deteriorate. Therefore, the degree of cross-linking of the synthetic resin sheet is preferably 7 to 70% by weight and more preferably 10 to 50% by weight.

The degree of cross-linking of the synthetic resin sheet is measured in the manner described below. First, A g of the synthetic resin sheet is weighed. Then the synthetic resin sheet is immersed in xylene at 120° C. for 24 hours, and undissolved components are filtrated with a 200-mesh wire screen. The residue on the wire screen is vacuum-dried, and the weight of the dried residue (B g) is measured. The degree of cross-linking can be computed from the following formula.

Degree of cross-linking (% by weight)=$(B/A) \times 100$

When a first synthetic resin of the two types of synthetic resins constituting the synthetic resin sheet mainly forms a matrix (a sea phase) and a second synthetic resin mainly forms a dispersed phase (an island phase) in the matrix to thereby form a sea-island structure, charges are more likely to be retained in the interface between the dispersed phase and the matrix in contact with the dispersed phase and the vicinities thereof. In interfacial portions between the dispersed phase and the matrix with the interfacial portions facing each other across the dispersed phase, when the synthetic resin sheet is electrified, a first (one) interfacial portion is positively charged and a second (the other) interfacial portion is negatively charged, with the charges being apparently polarized.

The charges in the electrified interfacial portions between the matrix and the dispersed phase are surrounded by the matrix and are therefore substantially electrically shielded from the outside. Accordingly, the charges retained in the interfacial portions between the matrix and the dispersed phase are stably maintained for a long time, and the electret sheet thereby has high piezoelectric properties for a long time.

When the electret sheet is deformed by an external force, its morphology changes, and the relative positional relation between the positive and negative charges in the electrified interfacial portions between the matrix and the dispersed phase is changed, whereby an electric response is generated. In the manner described above, the electret sheet exhibits improved piezoelectric properties.

The phrase "the first synthetic resin mainly forms the matrix and the second synthetic resin mainly forms the dispersed phase" used herein does not mean that the entire first synthetic resin forms the matrix and the entire second synthetic resin forms the dispersed phase. This phrase means that the amount of the first synthetic resin forming the matrix is larger than 50% of the total amount of the first synthetic resin and the amount of the second synthetic resin forming the dispersed phase is more than 50% of the total amount of the second synthetic resin. The phrase is meant to include the case in which part of the first synthetic resin forms a dispersed phase with part of the second synthetic resin forming a matrix.

A dispersed phase is an aggregation of a synthetic resin surrounded entirely by another synthetic resin, and an aggregation of a synthetic resin other than the above aggregation is referred to as a matrix. The ratio of the synthetic resin forming the dispersed phase or the matrix is measured in the following manner. First, the electret sheet is stained with $RuO_4$. Then the stained electret sheet is cut, and a magnified photograph of the cross-section is taken using a transmission electron microscope (TEM) at an observation magnification of 1,000 times to 10,000 times. The observation magnification may be set appropriately and is preferably adjusted such that the sea-island structure of the synthetic resins can be recognized and 100 to 500 regions of the dispersed phase can be observed in the photograph.

Then the percentage (%) of the total area of the dispersed phase or the matrix formed of a measurement target synthetic resin with respect to the total area of the synthetic resins in the magnified photograph is computed.

The percentage (%) of the total area of the dispersed phase or the matrix formed of the measurement target synthetic resin with respect to the total area of the synthetic resins can be measured using any image processing software. The percentage can be measured using image processing software such as "WinROOF Ver5.03" commercially available from MITANI CORPORATION, "analySIS FIVE" commercially available from Olympus Corporation, "Image Pro AMS" commercially available from NIPPON ROPER K.K., "Image J" commercially available from NIH Image, "Ryushi Kaiseki (particle analyzer)" commercially available from Sumitomo Metal Technology, Inc., or "general-purpose image processing software" commercially available from Image Sense Co., Ltd.

A detailed description will next be given of a measurement method using "WinROOF Ver5.03" commercially available from MITANI CORPORATION. Specifically, an exemplary case in which the polypropylene-based resin mainly forms the dispersed phase and the polyethylene-based resin mainly forms the matrix will be described. A binarization method will be described first. In the magnified photograph, since the portions formed of the polypropylene-based resin are stained black with $RuO_4$ and are darker than the polyethylene-based resin, settings are made such that the black and dark portions are extracted. A grayscale TEM image stored in a bitmap format is read, and an "automatic binarization" command is executed.

Next, unnecessary portions of the image are erased, and the image is cleaned. A "shrinking" command is executed three times to isolate the regions of the dispersed phase integrated in the processing from each other. Next, an "erase" command is used to erase dot-noises equal to or less than 50 pixels. Then an "exclusive dilation" command is executed three times to reconstruct the isolated regions of the dispersed phase without integration. Finally, a "closing" command is executed two times to integrate regions very close to each other, and the image processing for measurement is ended.

Then the shape of each of the regions of the dispersed phase is measured as follows. "Particle Features" in a "measurement" tab is selected. A measurement item "area" is selected to perform the measurement, and the sum is computed using, for example, spreadsheet software, whereby the percentage (%) of the total area of the dispersed phase formed of the polypropylene-based resin and the percentage (%) of the total area of the matrix with respect to the total area of the synthetic resins can be computed. When the percentage (%) of the total area of the dispersed phase formed of the polyethylene-based resin and the percentage (%) of the total area of the matrix with respect to the total area of the synthetic resins are computed, white-and-black inversion is applied to the automatic binarized TEM image by using image processing, and then the measurement is performed in the same manner as described above.

When image processing software other than "WinROOF Ver5.03" commercially available from MITANI CORPORATION is used, "area" measurement provided in the image processing software used is performed, whereby the percentage (%) of the total area of the dispersed phase or matrix formed of a measurement target synthetic resin with respect to the total area of the synthetic resins can be measured.

As shown in FIGS. 1 and 2, the dispersed phase preferably has a linear shape. In FIGS. 1 and 2, black (dark) regions are the dispersed phase. The dispersed phase having a linear shape is more easily deformed by applying an external force to the electret sheet to deform it. Therefore, the relative positional relation between the positive and negative charges in the electrified interfacial portions between the matrix and the dispersed phase is more likely to be changed, and this change is more likely to cause an electric response, so that the electret sheet exhibits higher piezoelectric properties.

Examples of the indicator indicating that the dispersed phase has a linear shape include an average linear factor. The average linear factor of the dispersed phase can be defined by formula 1 below.

[Mathematical formula 2]

Average linear factor of dispersed phase = $\left\{\sum_{i=1}^{n} \left(\pi \times (L_i/2)^2 / A_i\right)\right\}/n$   Formula 1

Here, $L_i$ is the maximum length of the i-th region of the dispersed phase, $A_i$ is the area of the i-th region of the dispersed phase, and n is the number of regions of the dispersed phase in the field of view. The maximum length of a region of the dispersed phase is the maximum value of the lengths of lines obtained by connecting two points on the contour of the region of the dispersed phase.

For example, the linear factor of the dispersed phase can be measured in the following manner. The linear factor of the dispersed phase can be measured using any image processing software described above. For example, image processing software "WinROOF Ver5.03" commercially available from MITANI CORPORATION can be used for the measurement.

Specifically, an exemplary case in which the polypropylene-based resin mainly forms the dispersed phase and the polyethylene-based resin mainly forms the matrix will be described. A binarization method will be described first. In the magnified photograph, since the portions formed of the polypropylene-based resin are stained black with $RuO_4$ and are darker than the polyethylene-based resin, settings are made such that the black and dark portions are extracted. A grayscale TEM image stored in a bitmap format is read, and an "automatic binarization" command is executed.

Next, unnecessary portions of the image are erased, and the image is cleaned. A "shrinking" command is executed three times to isolate the regions of the dispersed phase integrated in the processing from each other. Next, an "erase" command is used to erase dot-noises equal to or less than 50 pixels. Then an "exclusive dilation" command is executed three times to reconstruct the isolated regions of the dispersed phase without integration. Finally, a "closing" command is executed two times to integrate regions very close to each other, and the image processing for measurement is ended.

Then the shape of each of the regions of the dispersed phase is measured as follows. "Particle Features" in a "measurement" tab is selected. A measurement item "linear factor" is selected to perform the measurement. The linear factor is a value computed as $\pi(L_i/2)^2/A_i$ and is represented by the ratio of the area of a circle having the same diameter as the maximum length $L_i$ of a region of the dispersed phase to the area of the region of the dispersed phase. The value of the linear factor approaches 1.0 as the shape of the region of the dispersed phase approaches a circle and increases as the shape of the region of the dispersed phase is elongated.

The shapes of all the regions of the dispersed phase in the field of view are converted to numbers by the above procedure. The average linear factor may be computed from the obtained data using, for example, spreadsheet software according to formula 1 above. Here, $L_i$ is the maximum length of each region of the dispersed phase, $A_i$ is the area of each region of the dispersed phase, and n is the number (natural number) of the regions of the dispersed phase in the field of view.

When different image processing software is used, for example, "analySIS FIVE" available from Olympus Corporation is used, the average linear factor can be computed by measuring the "linear factors" of the regions of the dispersed phase using the values of "degree of circularity." In other image processing software, the average linear factor can be computed by measuring the "linear factors" using the values of "maximum diameter" and "area" provided in each image processing software.

If the average linear factor of the dispersed phase is small, the dispersed phase has a shape close to a circle. In such a case, the dispersed phase is less likely to be deformed by an external force applied to the electret sheet, so that the piezoelectric properties of the electret sheet may deteriorate. Therefore, the average linear factor is preferably 3.0 or larger.

The synthetic resin sheet may not be foamed or may be foamed. However, a foamed synthetic resin sheet is preferred. When the synthetic resin sheet is a foamed sheet, the bubbles in the foamed synthetic resin sheet are easily deformed by an external force applied to the electret sheet. Therefore, the relative positional relation between the positive and negative charges in the electrified walls of the bubbles and the electrified interfacial portions between the two types of synthetic resins is more likely to be changed, and this change is more likely to cause an electric response, so that the electret sheet exhibits higher piezoelectric properties.

If the apparent density of the foamed synthetic resin sheet is low, the mechanical strength of the electret sheet may become low, and the permanent compression strain of the electret sheet may become large. If the apparent density is high, the deformation of the foamed synthetic resin sheet may become small, and the degree of improvement in the piezoelectric properties of the electret sheet may be small. Therefore, the apparent density of the foamed synthetic resin sheet is preferably 0.025 to 0.9 g/cm$^3$ and more preferably 0.03 to 0.6 g/cm$^3$. The apparent density of the foamed synthetic resin sheet is a value measured according to JIS K7222.

In the above description, the synthetic resin sheet is foamed so that bubbles are present in the synthetic resin sheet. The bubbles are easily deformed by applying an external force to the synthetic resin sheet, so that the relative positional relation between the positive and negative charges in the electrified walls of the bubbles and the electrified interfacial portions between the two types of synthetic resins is easily changed.

However, instead of foaming the synthetic resin sheet, hollow particles deformable by an external force may be added to a non-foamed synthetic resin sheet. Examples of such hollow particles include glass balloons, hollow ceramic balloons, and hollow synthetic resin balloons. Of these, glass balloons are preferred because charges are easily maintained in the interfaces between the synthetic resins and the hollow particles and the electret sheet is more likely to maintain high piezoelectric properties for a long time.

If the average particle diameter of the hollow particles is small, the effect of the added hollow particles may not be achieved, and the piezoelectric properties of the electret sheet may not be much improved. If the average particle diameter is large, the mechanical strength of the electret sheet may become low. Therefore, the average particle diameter of the hollow particles is preferably 0.03 to 300 µm and more preferably 0.1 to 100 µm. The average particle diameter of the hollow particles is a value measured according to JIS Z8901.

If the true density (particle density) of the hollow particles is small, the hollow particles may be broken when the electret sheet is deformed by the application of stress thereto. In such a case, the piezoelectric properties of the electret sheet deteriorate. If the true density is large, the effect of the hollow particles added may not be achieved, and the piezoelectric properties of the electret sheet may not be much improved. Therefore, the true density of the hollow particles is preferably 0.1 to 0.9 g/cm$^3$ and more preferably 0.2 to 0.7 g/cm$^3$. The true density of the hollow particles is a value obtained by dividing the weight of the hollow particles by the apparent volume thereof. The true density of the hollow particles can be measured using, for example, an automatic dry-type density meter commercially available from Shimadzu Corporation under the product name "AccuPyc II 1340 series".

If the amount of the hollow particles contained in the synthetic resin sheet is small, the effect of the hollow particles added may not be achieved, and the piezoelectric properties of the electret sheet may not be much improved. If the amount is large, the mechanical strength of the electret sheet may deteriorate. Therefore, the amount of the hollow particles is preferably 1 to 60 parts by weight based on 100 parts by weight of the total amount of the synthetic resins and more preferably 5 to 50 parts by weight.

Additives such as an antioxidant, a metal-induced deterioration inhibitor, and an ultraviolet absorber may be added to the synthetic resin sheet, so long as the physical properties thereof are not impaired.

Next, a method of producing the electret sheet will be described. In the method of producing the electret sheet, a synthetic resin sheet, i.e., a non-foamed synthetic resin sheet or a foamed synthetic resin sheet, is first produced by a general procedure using a synthetic resin composition containing two types of synthetic resins incompatible with each other and a polyfunctional monomer.

Specific examples of the method of producing the non-foamed synthetic resin sheet include a method including: supplying a synthetic resin composition containing the two types of synthetic resins incompatible with each other to an extruder; melting and kneading the synthetic resin composition; extruding the synthetic resin composition from a T die attached to the extruder into a sheet shape to produce a non-foamed synthetic resin sheet; and cross-linking the non-foamed synthetic resin sheet.

Examples of the method of producing the foamed synthetic resin sheet include a method including: supplying a synthetic resin composition containing the two types of synthetic resins incompatible with each other, the polyfunctional monomer, and a foaming agent to an extruder; melting and kneading the synthetic resin composition; extruding a foamable resin sheet from a T die attached to the extruder; cross-linking the foamable resin sheet; and heating the foamable resin sheet to foam it, whereby the foamed synthetic resin sheet is produced.

No particular limitation is imposed on the method of cross-linking the non-foamed synthetic resin sheet or the foamable resin sheet, and examples thereof include a method in which the non-foamed synthetic resin sheet or the foamable resin sheet is irradiated with ionizing radiation. Examples of the ionizing radiation include an electron beam, $\alpha$ rays, $\beta$ rays, and $\gamma$ rays.

If the amount of ionizing radiation applied to the non-foamed synthetic resin sheet or the foamable resin sheet is small, the amount of the cross-linked structure introduced into the synthetic resins becomes small, and the piezoelectric properties of the electret sheet may deteriorate. If the amount of ionizing radiation is large, the electret sheet becomes hard, and the deformation of the electret sheet may become insufficient, so that the piezoelectric properties of the electret sheet may deteriorate. Therefore, the amount of ionizing radiation is preferably 1 to 200 kGy and more preferably 3 to 100 kGy.

If the acceleration voltage of the ionizing radiation applied to the non-foamed synthetic resin sheet or the foamable resin sheet is small, the ionizing radiation is absorbed only by the surface portion of the sheet, and the amount of the cross-linked structure in the central portion in the thickness direction thereof of the non-foamed synthetic resin sheet or the foamable resin sheet becomes small. In such a case, the piezoelectric properties of the electret sheet may deteriorate. If the acceleration voltage is high, the energy of the ionizing radiation is not absorbed by the non-foamed synthetic resin sheet or the foamable resin sheet and is transmitted therethrough. In such a case, the amount of the cross-linked structure becomes small, and the piezoelectric properties of the electret sheet may deteriorate. Therefore, the acceleration voltage of the ionizing radiation is preferably 100 to 1,000 kV.

Next, when the two types of synthetic resins constituting the synthetic resin sheet form a sea-island structure, the synthetic resin sheet may be uniaxially or biaxially drawn by a general procedure in order to make the dispersed phase more linear. If the uniaxial draw ratio of the synthetic resin sheet is small, the shape of the dispersed phase does not approach a linear shape, and an electret sheet having improved piezoelectric properties may not be obtained. Therefore, the uniaxial draw ratio is preferably 1.2 times or higher, more preferably 1.5 times or higher, and particularly preferably 2 times or higher. The uniaxial draw ratio of the synthetic resin sheet can be increased up to the limit of production. However, the uniaxial draw ratio is preferably 10 times or lower and more preferably 5 times or lower. The uniaxial draw ratio of the synthetic resin sheet is a value obtained by dividing the length of the drawn synthetic resin sheet in a uniaxial drawing direction by the length of the synthetic resin sheet before drawing.

If the biaxial draw ratio of the synthetic resin sheet is small, the shape of the dispersed phase does not approach a linear shape, and an electret sheet having improved piezoelectric properties may not be obtained. Therefore, the biaxial draw ratio is preferably 1.2 times or higher, more preferably 1.5 times or higher, and particularly preferably 2 times or higher. The biaxial draw ratio of the synthetic resin sheet can be increased up to the limit of production. However, the biaxial draw ratio is preferably 10 times or lower and more preferably 5 times or lower. The biaxial draw ratio of the synthetic resin sheet is a value obtained by dividing the area of the drawn synthetic resin sheet by the area of the synthetic resin sheet before drawing.

Thereafter, charges are injected into the synthetic resin sheet by a general procedure to electrify the synthetic resin sheet, whereby an electret sheet can be produced. No particular limitation is imposed on the method of injecting charges into the synthetic resin sheet. Examples of the injection method include: (1) a method including holding the synthetic resin sheet between a pair of first and second flat electrodes, grounding the first flat electrode, connecting the second flat electrode to a high-voltage DC power supply, and applying a high DC or pulse voltage to the synthetic resin sheet to inject charges into the synthetic resins, whereby the synthetic resin sheet is electrified; (2) a method including irradiating the synthetic resin sheet with ultraviolet rays or ionizing radiation such as an electron beam and X-rays to ionize air molecules located near the synthetic resin sheet, whereby charges are injected into the synthetic resins and the synthetic resin sheet is thereby electrified; and (3) a method including stacking a grounded flat electrode on a first surface of the synthetic resin sheet such that they are in close contact with each other, disposing needle-shaped electrodes or wire electrodes electrically connected to a high-voltage DC power supply at predetermined intervals on a second surface of the synthetic resin sheet, and generating corona discharge near the front ends of the needle-shaped electrodes or the surfaces of the wire electrodes by concentration of an electric field to ionize air molecules, whereby charges are injected into the synthetic resins by repulsion of the air ions generated by the polarity of the needle-shaped electrodes or wire electrodes and the synthetic resin sheet is thereby electrified. Among the above methods, methods (2) and (3) are preferred because charges can be easily injected into the synthetic resin sheet, and method (2) is more preferred.

In methods (1) and (3) above, if the absolute value of the voltage applied to the synthetic resin sheet is small, a sufficient amount of charges may not be injected into the synthetic resin sheet, and an electret sheet having high piezoelectric properties may not be obtained. If the absolute value of the voltage is large, arc discharge may occur. In such a case, a sufficient amount of charges may not be injected into the synthetic resin sheet, and an electret sheet having high piezoelectric properties may not be obtained. Therefore, the absolute value of the voltage is preferably 3 to 100 kV and more preferably 5 to 50 kV.

In method (2) above, if the absolute value of the acceleration voltage of the ionizing radiation applied to the synthetic resin sheet is small, the molecules in the air may not be sufficiently ionized. In such a case, a sufficient amount of charges may not be injected into the synthetic resin sheet, and an electret sheet having high piezoelectric properties may not be obtained. If the absolute value of the acceleration voltage is large, the ionizing radiation is transmitted through the air, so that the molecules in the air may not be ionized. Therefore, the absolute value of the acceleration voltage is preferably 5 to 15 kV.

In the electret sheet obtained in the manner described above, the relative positional relation between the apparently polarized positive and negative charges in the interfacial portions between the two types of synthetic resins is changed by applying an external force to the electret sheet to deform it, and the change causes an electric response, whereby the electret sheet exhibits high piezoelectric properties.

Advantageous Effects of Invention

The electret sheet of the present invention has the above-described structure, and positive and negative charges in an apparently polarized state are present in the interfacial portions between the two types of synthetic resins incompatible with each other. When an external force is applied to the electret sheet and the electret sheet is deformed, the relative positions of these positive and negative charges are changed, and these changes cause a good electric response. Therefore, the electret sheet has high piezoelectric properties.

In the electret sheet of the present invention, the two types of synthetic resins are cross-linked through the polyfunctional monomer. Therefore, the cross-linked structure of the synthetic resins prevents the positive and negative charges present in the interfacial portions between the two types of synthetic resins from being dissipated to the outside of the synthetic resin sheet. The electret sheet thereby maintains high piezoelectric properties stably for a long time.

In the above electret sheet, when the first synthetic resin among the two types of synthetic resins mainly forms the matrix and the second synthetic resin mainly forms the dispersed phase to thereby form a sea-island structure, the charges in the electrified interfacial portions between the matrix and the dispersed phase are substantially electrically shielded from the outside of the synthetic resin sheet by the matrix. Therefore, the charges held in the interfacial portions between the matrix and the dispersed phase are held stably for a long time, so that the electret sheet maintains high piezoelectric properties for a long time.

In the electret sheet, when the synthetic resins contain a polypropylene-based resin and a polyethylene-based resin, the polypropylene-based resin and the polyethylene-based resin form a fine phase separated structure, and many interfacial portions between the polypropylene-based resin and the polyethylene-based resin can be formed. Therefore, a larger amount of charges in a polarized state can be held in the synthetic resin sheet, and the obtained electret sheet has high piezoelectric properties.

In the electret sheet, when the synthetic resin sheet is a foamed synthetic resin sheet or when the synthetic resin sheet is a non-foamed sheet and contains hollow particles, charges are easily held also in the interfaces between the synthetic resins and the hollow particles and the vicinities thereof and an apparently polarized structure is formed. Therefore, the bubbles in the foamed synthetic resin sheet or the hollow particles in the non-foamed synthetic resin sheet are easily deformed by applying an external force to the electret sheet, and the electret sheet is easily deformed. Therefore, the relative positions of the positive and negative charges in the electret sheet are easily changed, and the changes cause a favorable electric response, so that the electret sheet has higher piezoelectric properties.

DESCRIPTION OF EMBODIMENTS

Figure 1:
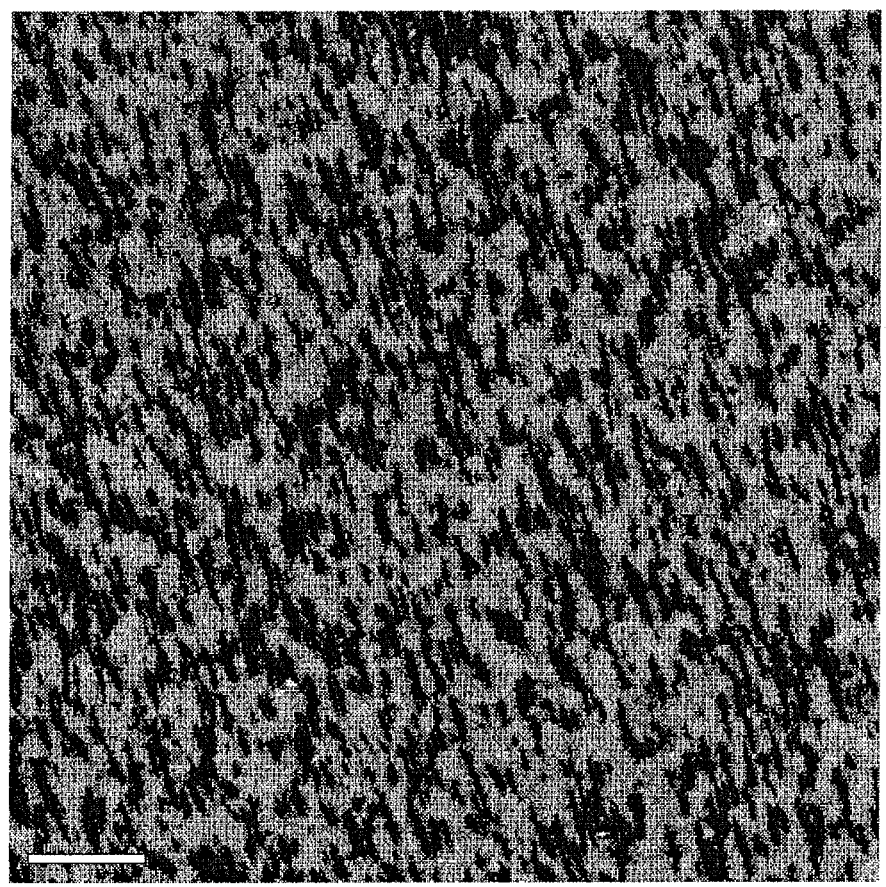
FIG. 1 is a transmission electron micrograph showing a cross section of an electret sheet.
Figure 2:
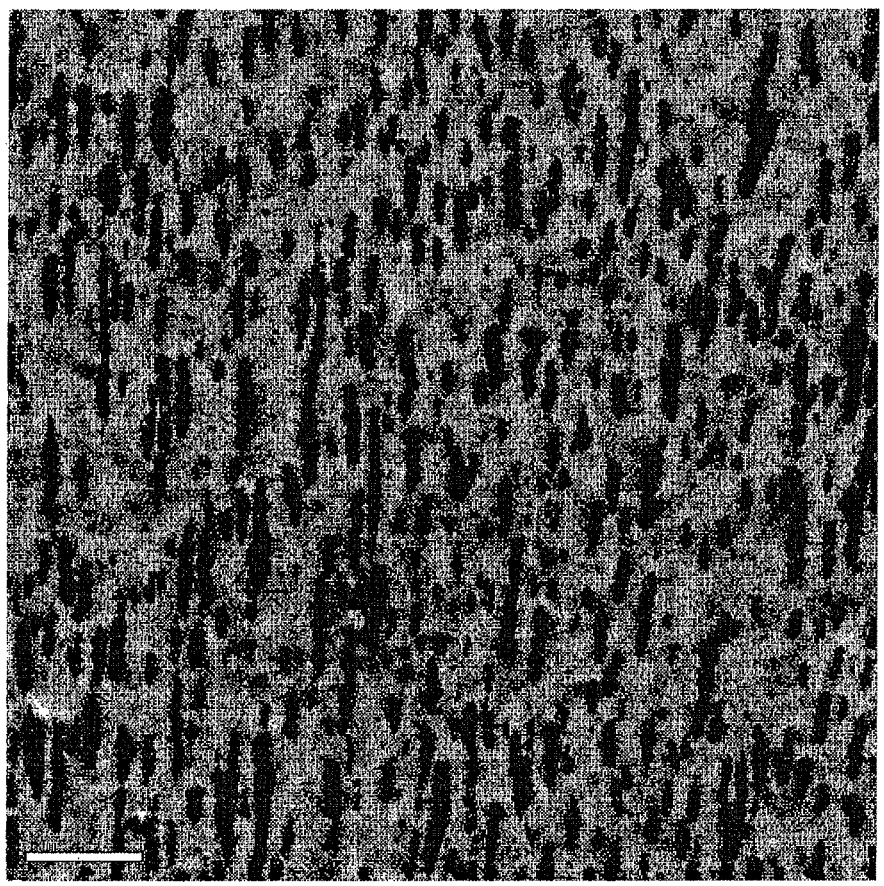
FIG. 2 is a transmission electron micrograph showing a cross section of an electret sheet.

Examples of the present invention will next be described, but the present invention is not limited to the following Examples.

Examples 1 to 8 and Comparative Examples 1 TO 3

A synthetic resin composition containing homopolypropylene A (product name: "NOVATEC PP EA9", manufactured by Japan Polypropylene Corporation, bending modulus: 1,800 MPa, melt flow rate (MFR): 0.5 g/10 minutes), homopolypropylene B (product name: "NOVATEC PP EA8W", manufactured by Japan Polypropylene Corporation, bending modulus: 1,500 MPa, melt flow rate: 0.8 g/10 minutes), homopolypropylene C (product name: "NOVATEC PP EG8", manufactured by Japan Polypropylene Corporation, bending modulus: 950 MPa, melt flow rate: 0.8 g/10 minutes), low-density linear polyethylene (product name: "MORETEC 0138N", manufactured by Prime Polymer Co., Ltd., density: 0.917 kg/m$^3$, melt flow rate: 1.3 g/10 minutes), trimethylolpropane trimethacrylate (TMPT), divinylbenzene, azodicarbonamide, 2,6-dibutyl-p-cresol and dilauryl thiopropionate that serve as antioxidants, and methylbenzotriazole used as a metal-induced deterioration inhibitor in prescribed amounts shown in TABLE 1 or 2 was melted and kneaded sufficiently using a twin screw extruder with a barrel temperature adjusted to 170° C. and then extruded from a T die to obtain a foamable resin sheet having a thickness of 0.3 mm.

The foamable resin sheet was irradiated with 25 kGy of an electron beam under the condition of an acceleration voltage of 300 kV to cross-link the foamable resin sheet. This foamable resin sheet was placed in a hot-air oven at 250° C. to foam the foamable resin sheet by decomposition of azodicarbonamide, whereby a foamed synthetic resin sheet having an apparent density of 0.2 g/cm$^3$ and a thickness of 0.5 mm was obtained.

The obtained foamed sheet was uniaxially drawn at a draw ratio of 2 times in an atmosphere of 150° C. to obtain a uniaxially drawn foamed synthetic resin sheet having a thickness of 0.3 mm. This uniaxially drawn foamed synthetic resin sheet was subjected to a corona discharge treatment under the conditions of a voltage of −10 kV, a discharge distance of 10 mm, and a voltage application time of 1 minute to inject charges into the uniaxially drawn foamed synthetic resin sheet. The uniaxially drawn foamed synthetic resin sheet was thereby electrified, and an electret sheet was obtained.

Example 9 and Comparative Example 4

A synthetic resin composition containing homopolypropylene A (product name: "NOVATEC PP EA9", manufactured by Japan Polypropylene Corporation, bending modulus: 1,800 MPa, melt flow rate: 0.5 g/10 minutes), low-density linear polyethylene (product name: "MORETEC 0138N", manufactured by Prime Polymer Co., Ltd., density: 0.917 kg/m$^3$, melt flow rate: 1.3 g/10 minutes), trimethylolpropane trimethacrylate (TMPT), and glass balloons (product name: "Glass bubbles S60HS", manufactured by Sumitomo 3M Limited, average particle diameter: 50 μm, true density (particle density): 0.6 g/cm$^3$) in prescribed amounts shown in TABLE 1 or 2 was melted and kneaded sufficiently using a twin screw extruder with a barrel temperature adjusted to 170° C. and then extruded from a T die to obtain a non-foamed synthetic resin sheet having a thickness of 0.3 mm and an apparent density of 0.9 g/cm$^3$.

The non-foamed synthetic resin sheet was irradiated with 25 krGy of an electron beam under the condition of an acceleration voltage of 300 kV to cross-link the non-foamed synthetic resin sheet. The cross-linked non-foamed synthetic resin sheet was uniaxially drawn at a draw ratio of 2 times in an atmosphere of 150° C. to thereby obtain a uniaxially drawn non-foamed synthetic resin sheet having a thickness of 0.3 mm. This uniaxially drawn non-foamed synthetic resin sheet was subjected to corona discharge treatment under the conditions of a voltage of −10 kV, a discharge distance of 10 mm, and a voltage application time of 1 minute to inject charges into the uniaxially drawn non-foamed synthetic resin sheet.

The uniaxially drawn non-foamed synthetic resin sheet was thereby electrified, and an electret sheet was obtained.

The apparent density of each of the uniaxially drawn synthetic resin sheets constituting the electret sheets obtained in the Examples and Comparative Examples was measured according to JIS K7222, and the results are shown in TABLEs 1 and 2. The piezoelectric constant d33 of each of the obtained electret sheets was measured in the manner described below, and the results are shown in TABLEs 1 and 2.

The phase separated structure of the two types of synthetic resins included in each of the obtained electret sheets was observed in the manner described below.

(Piezoelectric constant d33)

A flat square test piece of side 30 mm was cut from an electret sheet. Two flat square aluminum foils with side 25 mm were prepared. The aluminum foils used as flat electrodes were stacked on both sides of the test piece to produce a specimen.

A pressing force was applied to the specimen using a vibrator under the conditions of a load F of 1 N, a dynamic load of ±0.25 N, and a frequency of 90 Hz, and a charge Q (coulomb) generated at that time was measured. The charge Q (coulomb) was divided by the load F (N) to compute the piezoelectric constant d33. A piezoelectric constant dij means that the load is in a j-direction and the charge is in an i-direction. The d33 means that the load is in the thickness direction of the electret sheet and the charge is in the thickness direction.

(Phase Separated Structure)

Each of the obtained electret sheets was stained with $RuO_4$ and then cut along a plane in the extrusion direction of the electret sheet over the entire length in the thickness direction. A magnified photograph of the cut surface was taken using a transmission electron microscope (TEM) at an observation magnification of 3,000 times.

Whether or not the two types of synthetic resins formed a phase separated structure was observed in the obtained magnified photograph of the cut surface. When the two types of synthetic resins formed a phase separated structure, whether or not the two types of synthetic resins formed a sea-island structure was observed. When the sea-island structure was formed, measurement was made to determine which synthetic resin mainly formed the matrix or the dispersed phase. In TABLEs 1 and 2, homopropylene is denoted as "PP", and low-density linear polyethylene is denoted as "PE".

In the case in which the two types of synthetic resins formed a sea-island structure, when the homopolypropylene mainly formed the dispersed phase, the average linear factor of the dispersed phase was measured.

TABLE 1

| | | EXAMPLE 1 | EXAMPLE 2 | EXAMPLE 3 | EXAMPLE 4 | EXAMPLE 5 |
|---|---|---|---|---|---|---|
| HOMOPOLYPROPYLENE | A (BENDING MODULUS: 1800 MPa, MFR: 0.5 g/10 minutes) | 50 | 75 | 90 | 25 | 10 |
| | B (BENDING MODULUS: 1500 MPa, MFR: 0.8 g/10 minutes) | 0 | 0 | 0 | 0 | 0 |
| | C (BENDING MODULUS: 950 MPa, MFR: 0.8 g/10 minutes) | 0 | 0 | 0 | 0 | 0 |
| LOW-DENSITY LINEAR POLYETHYLENE (DENSITY: 0.917 kg/m³, MFR: 1.3 g/10 minutes) | | 50 | 25 | 10 | 75 | 90 |
| POLYFUNCTIONAL ACRYLATE | TRIMETHYLOLPROPANE TRIMETHACRYLATE | 3.5 | 3.5 | 3.5 | 3.5 | 3.5 |
| | DIVINYLBENZENE | 0 | 0 | 0 | 0 | 0 |
| FOAMING AGENT | AZODICARBONAMIDE | 3.3 | 3.3 | 3.3 | 3.3 | 3.3 |
| HOLLOW PARTICLES | GLASS BALLOONS | 0 | 0 | 0 | 0 | 0 |
| ANTIOXIDANT | 2,6-DIBUTYL-p-CRESOL | 0.3 | 0.3 | 0.3 | 0.3 | 0.3 |
| | DILAURYL THIOPROPIONATE | 0.3 | 0.3 | 0.3 | 0.3 | 0.3 |
| METAL-INDUCED DETERIORATION | METHYLBENZOTRIAZOLE | 0.5 | 0.5 | 0.5 | 0.5 | 0.5 |
| ELECTRON BEAM INTENSITY (kGy) | | 25 | 25 | 25 | 25 | 25 |
| CORONA DISCHARGE TREATMENT [VOLTAGE (kV)/DISTANCE (mm)/TIME (MINUTES)] | | −10/10/1 | −10/10/1 | −10/10/1 | −10/10/1 | −10/10/1 |
| SEA-ISLAND STRUCTURE | PRESENCE | YES | YES | YES | YES | YES |
| | DISPERSED PHASE | PP | PE | PE | PP | PP |
| | AVERAGE LINEAR FACTOR | 3.57 | — | — | 4.21 | 4.52 |
| SYNTHETIC RESIN SHEET | APPARENT DENSITY (g/cm³) | 0.2 | 0.2 | 0.2 | 0.2 | 0.2 |
| | THICKNESS (mm) | 0.3 | 0.3 | 0.3 | 0.3 | 0.3 |
| PIEZOELECTRIC CONSTANT d33 | | 250 | 243 | 169 | 177 | 145 |

| | | EXAMPLE 6 | EXAMPLE 7 | EXAMPLE 8 | EXAMPLE 9 |
|---|---|---|---|---|---|
| HOMOPOLYPROPYLENE | A (BENDING MODULUS: 1800 MPa, MFR: 0.5 g/10 minutes) | 0 | 0 | 50 | 50 |
| | B (BENDING MODULUS: 1500 MPa, MFR: 0.8 g/10 minutes) | 50 | 0 | 0 | 0 |
| | C (BENDING MODULUS: 950 MPa, MFR: 0.8 g/10 minutes) | 0 | 50 | 0 | 0 |
| LOW-DENSITY LINEAR POLYETHYLENE (DENSITY: 0.917 kg/m³, MFR: 1.3 g/10 minutes) | | 50 | 50 | 50 | 50 |
| POLYFUNCTIONAL ACRYLATE | TRIMETHYLOLPROPANE TRIMETHACRYLATE | 3.5 | 3.5 | 0 | 3.5 |
| | DIVINYLBENZENE | 0 | 0 | 3.5 | 0 |
| FOAMING AGENT | AZODICARBONAMIDE | 3.3 | 3.3 | 3.3 | 0 |
| HOLLOW PARTICLES | GLASS BALLOONS | 0 | 0 | 0 | 40 |

TABLE 1-continued

|  |  |  |  |  |  |
|---|---|---|---|---|---|
| ANTIOXIDANT | 2,6-DIBUTYL-p-CRESOL | 0.3 | 0.3 | 0.3 | 0 |
|  | DILAURYL THIOPROPIONATE | 0.3 | 0.3 | 0.3 | 0 |
| METAL-INDUCED DETERIORATION | METHYLBENZOTRIAZOLE | 0.5 | 0.5 | 0.5 | 0 |
| ELECTRON BEAM INTENSITY (kGy) |  | 25 | 25 | 25 | 25 |
| CORONA DISCHARGE TREATMENT [VOLTAGE (kV)/DISTANCE (mm)/TIME (MINUTES)] |  | −10/10/1 | −10/10/1 | −10/10/1 | −10/10/1 |
| SEA-ISLAND STRUCTURE | PRESENCE | YES | YES | YES | YES |
|  | DISPERSED PHASE | PP | PP | PP | PP |
|  | AVERAGE LINEAR FACTOR | 3.25 | 2.85 | 3.42 | 3.66 |
| SYNTHETIC RESIN SHEET | APPARENT DENSITY (g/cm³) | 0.2 | 0.2 | 0.2 | 0.9 |
|  | THICKNESS (mm) | 0.3 | 0.3 | 0.3 | 0.3 |
| PIEZOELECTRIC CONSTANT d33 |  | 182 | 152 | 211 | 163 |

TABLE 2

|  |  | COMPARATIVE EXAMPLE 1 | COMPARATIVE EXAMPLE 2 | COMPARATIVE EXAMPLE 3 | COMPARATIVE EXAMPLE 4 |
|---|---|---|---|---|---|
| HOMOPOLYPROPYLENE | A (BENDING MODULUS: 1800 MPa, MFR: 0.5 g/10 minutes) | 100 | 0 | 50 | 100 |
|  | B (BENDING MODULUS: 1500 MPa, MFR: 0.8 g/10 minutes) | 0 | 0 | 0 | 0 |
|  | C (BENDING MODULUS: 950 MPa, MFR: 0.8 g/10 minutes) | 0 | 0 | 0 | 0 |
| LOW-DENSITY LINEAR POLYETHYLENE (DENSITY: 0.917 kg/m³, MFR: 1.3 g/10 minutes) |  | 0 | 100 | 50 | 0 |
| POLYFUNCTIONAL ACRYLATE | TRIMETHYLOLPROPANE TRIMETHACRYLATE | 3.5 | 3.5 | 0 | 3.5 |
|  | DIVINYLBENZENE | 0 | 0 | 0 | 0 |
| FOAMING AGENT | AZODICARBONAMIDE | 3.3 | 3.3 | 3.3 | 0 |
| HOLLOW PARTICLES | GLASS BALLOONS | 0 | 0 | 0 | 40 |
| ANTIOXIDANT | 2,6-DIBUTYL-p-CRESOL | 0.3 | 0.3 | 0.3 | 0 |
|  | DILAURYL THIOPROPIONATE | 0.3 | 0.3 | 0.3 | 0 |
| METAL-INDUCED DETERIORATION | METHYLBENZOTRIAZOLE | 0.5 | 0.5 | 0.5 | 0 |
| ELECTRON BEAM INTENSITY (kGy) |  | 25 | 25 | 25 | 25 |
| CORONA DISCHARGE TREATMENT [VOLTAGE (kV)/DISTANCE (mm)/TIME (MINUTES)] |  | −10/10/1 | −10/10/1 | −10/10/1 | −10/10/1 |
| SEA-ISLAND STRUCTURE | PRESENCE | YES | YES | YES | YES |
|  | DISPERSED PHASE | PE | PE | PP | PE |
|  | AVERAGE LINEAR FACTOR | — | — | 3.49 | — |
| SYNTHETIC RESIN SHEET | APPARENT DENSITY (g/cm³) | 0.2 | 0.2 | 0.2 | 0.9 |
|  | THICKNESS (mm) | 0.3 | 0.3 | 0.3 | 0.3 |
| PIEZOELECTRIC CONSTANT d33 |  | 130 | 121 | 69 | 97 |

INDUSTRIAL APPLICABILITY

The electret sheet of the present invention has high piezoelectric properties and can be used for various applications such as acoustic pickups and various pressure sensors.

The invention claimed is:

1. An electret sheet, comprising a synthetic resin sheet electrified by injecting electric charges thereinto, the synthetic resin sheet comprising two types of synthetic resins incompatible with each other, these synthetic resins forming a phase separated, sea-island structure and being cross-linked through a polyfunctional monomer.

2. The electret sheet according to claim 1, wherein the synthetic resin sheet is a foamed synthetic resin sheet.

3. The electret sheet according to claim 1, wherein the synthetic resin sheet includes hollow particles.

4. The electret sheet according to claim 1, wherein a first synthetic resin of the two types of synthetic resins mainly forms a matrix and a second synthetic resin mainly forms a dispersed phase to thereby form a sea-island structure.

5. The electret sheet according to claim 1, wherein the synthetic resins include a polypropylene-based resin and a polyethylene-based resin.

6. The electret sheet according to claim 4, wherein a polypropylene-based resin mainly forms the matrix and a polyethylene-based resin mainly forms the dispersed phase.

7. The electret sheet according to claim 4, wherein a polypropylene-based resin mainly forms the dispersed phase, a polyethylene-based resin mainly forms the matrix, and an average linear factor of the dispersed phase computed using formula 1 is 3.0 or larger,

[Mathematical formula 1]

$$\text{Average linear factor of dispersed phase} = \left\{ \sum_{i=1}^{n} \left( \pi \times (L_i/2)^2 / A_i \right) \right\} / n \quad \text{Formula 1}$$

wherein, $L_i$ is a maximum length of an i-th region of the dispersed phase, $A_i$ is an area of the i-th region of the dispersed phase, and n is the number of regions of the dispersed phase in a field of view.

8. The electret sheet according to claim 5, wherein a bending modulus of the polypropylene-based resin is 1,400 MPa or higher.

9. The electret sheet according to claim 1, wherein the synthetic resins include a polypropylene-based resin in an amount of 10 to 95% by weight and a polyethylene-based resin in an amount of 5 to 90% by weight, and the polyfunctional monomer has, in its molecule, two or more functional groups selected from the group consisting of a vinyl group, an acryloyl group, a methacryloyl group, and an allyl group.

* * * * *